United States Patent [19]

Hakamada

[11] 4,403,243
[45] Sep. 6, 1983

[54] SEMI-CONDUCTOR LASER APPARATUS WITH SUPPORT AND SOLDERING MEANS FOR LIGHT-TRANSMITTING MEMBER

[75] Inventor: Isao Hakamada, Yokohama, Japan

[73] Assignee: Canon Kabushiki Kaisha, Tokyo, Japan

[21] Appl. No.: 259,157

[22] Filed: Apr. 30, 1981

Related U.S. Application Data

[63] Continuation of Ser. No. 907, Jan. 4, 1979, abandoned.

[30] Foreign Application Priority Data

Jan. 10, 1978 [JP] Japan ..................................... 53-1348

[51] Int. Cl.³ .................... H01L 23/02; H01L 23/12; H01L 33/00
[52] U.S. Cl. ........................... 357/74; 357/17; 357/30; 357/81; 174/50.62; 350/96.20; 350/96.21
[58] Field of Search ................. 357/74, 17, 30, 81, 357/79; 174/50.61, 50.62, 50.63, 66, 67; 350/96.20, 96.21

[56] References Cited

U.S. PATENT DOCUMENTS

| | | | |
|---|---|---|---|
| 2,788,381 | 4/1957 | Baldwin | 357/30 |
| 3,233,111 | 2/1966 | Pike | 357/74 |
| 3,281,606 | 10/1966 | Lueck | 357/74 |
| 3,482,198 | 12/1969 | Hooper | 357/74 |
| 3,500,099 | 3/1970 | Taylor | 357/30 |
| 3,584,265 | 6/1971 | Nier | 357/67 |
| 3,816,847 | 6/1974 | Nagao | 357/74 |
| 4,076,955 | 2/1978 | Gates | 357/74 |
| 4,131,911 | 12/1978 | Fujine et al. | 357/74 |
| 4,168,883 | 9/1979 | Macleod | 350/96.20 |
| 4,338,577 | 7/1982 | Sato et al. | 357/74 |

FOREIGN PATENT DOCUMENTS 714976 9/1954 United Kingdom .................. 357/81

*Primary Examiner*—Andrew J. James
*Attorney, Agent, or Firm*—Fitzpatrick, Cella, Harper & Scinto

[57] ABSTRACT

The present invention extends the service life of a semi-conductor laser element by bonding a light transmitting member for transmitting the output light from said laser element to a support member for said transmitting member with soft metal solder to improve hermetic sealing therebetween. The beam diameter of the output light generated by said semi-conductor laser element is not substantially changed when passing through the transmitting member since said bonding is conducted at a temperature not causing deformation by softening of said light transmitting member that could cause formation of a distortion therein. The surfacial precision of said light transmitting member also is improved by selecting the thermal expansion coefficient of the material constituting said light transmitting member to be approximately equal to that of said support member. Therefore, the invention provides a semi-conductor laser apparatus applicable in equipment requiring a high resolution.

32 Claims, 4 Drawing Figures

SEMI-CONDUCTOR LASER APPARATUS WITH SUPPORT AND SOLDERING MEANS FOR LIGHT-TRANSMITTING MEMBER

This is a continuation of application Ser. No. 000,907, filed Jan. 4, 1979, now abandoned.

BACKGROUND OF THE INVENTION

1. Field of the Invention

The present invention relates to a semi-conductor laser apparatus in which a light transmitting member for transmitting the output light generated by a semi-conductor laser element is bonded with a support member for said light transmitting member thereby hermetically to seal the interior of said support member.

2. Description of the Prior Art

In FIG. 1 there is shown a conventional semi-conductor laser apparatus in a partially broken schematic perspective view from which the lead wires to various terminals are omitted for the purpose of clarity, and in which there are represented a metallic base member 1, a cylindrical support member 2, an optical window 3 and a semi-conductor laser element 4 which is positioned in a sealed space defined by said support member 2, base member 1 and optical window 3.

Said optical window is usually composed of glass which is fused sealed to said support member 2 for achieving a necessary hermetic seal.

Such optical window sealed by a conventional glass fusion method has been obtained in the following manner. At first the support member 2 and the optical window 3 of predetermined sizes are set in a predetermined relationship, then subjected to a slow fusion in a furnace of a temperature determined by the species of the glass to be used for said optical window, said temperature being generally in a range of 400° to 500° C., and cooled in the furnace or in the air. However, though such glass fusion method provides satisfactory adhesion, the high temperature required for the treatment results in formation of distortion on the glass surfaces or of streaks and bubbles in the glass. Such optical window eventually enlarges the spot diameter of the laser beam when focused through a lens system, thus rendering impossible the use of such semi-conductor laser in the equipment requiring a high resolution.

SUMMARY OF THE INVENTION

A first object of the present invention is to improve the hermetic sealing of the interior of the support member for extending the service life of the semi-conductor laser element.

A second object of the present invention is to provide a light transmitting member capable of stabilizing the beam diameter of the output light generated by the semi-conductor laser element.

A third object of the present invention is to provide a semi-conductor laser apparatus with an improved surface precision of said light-transmitting member and thus applicable to the equipment requiring a high resolution.

DESCRIPTION OF THE PREFERRED EMBODIMENTS

Figure 2:
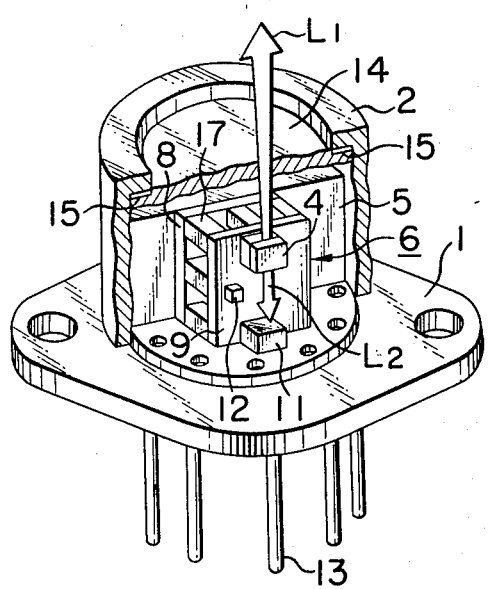
FIG. 2 is a partially broken away perspective view of a semi-conductor laser apparatus according to the present invention.

In FIG. 2 there is shown, in a partially broken away perspective view, a semi-conductor laser apparatus in accordance with the present invention from which the lead wires are omitted for the purpose of clarity. Said apparatus is provided with a metallic base member 1 and a cylindrical support member 2 for supporting an optical window 14 and protecting a semi-conductor laser element 4, the interior of said support member 2 forming, in combination with said base member 1 and optical window (light-transmitting member) 14, a sealed space in which is placed a metal block 5 partially adhered in fixed position to said support member 2 and base member 1. A cooling unit 6 comprises Peltier elements 7, a heat radiating end member 8 and a cooling end member 9, said radiating end member 8 being adhered in fixed position to said block 5. Thus the heat generated in said heat radiating end member 8 upon driving of said cooling unit 6 is transmitted through the block 5 to the support member 2 or to the base member 1 and dissipated to the outside.

On said cooling end member 9 composed for example of a metal plate, there is mounted a semi-conductor laser element 4 which emits laser light beams L1, L2 upon application of a voltage. Also there are shown a light detector 11 such as a photodiode for detecting the laser light beam L2, a temperature detector 12 the output of which is utilized for maintaining the temperature of the semi-conductor laser element 4 constant, connecting terminals 13 to the power supply source etc., and a soft metal solder 15.

Said optical window 14 is so selected as to have a thermal expansion coefficient equal or substantially equal to that of the support member 2, and is provided with a coating layer 16, matching the wavelength of the laser light to be transmitted, except at a peripheral portion 14a of the upper surface thereof for adhesion.

Figure 4:
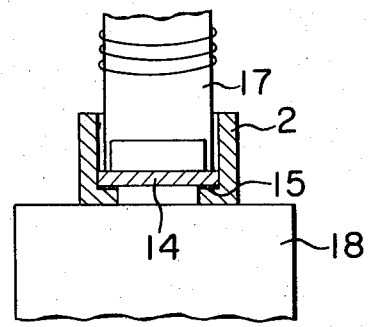
FIG. 4 is a cross-sectional view showing the bonding method of the support member and the optical window.

FIG. 4 shows the method of bonding the optical window 14 and the support member 2. At first the support member 2 is placed on a hot plate 18, and soft metal solder 15 is placed on said support member, which is maintained at a temperature higher by 20°–100° C. than the melting point of the soft metal solder 15. The optical window 14 provided with the aforementioned coating is placed in the predetermined position in said support member 2, and the bonding is completed adhering said optical window 14 to said support member 2 within several seconds under a suitable pressure and an ultrasonic wave to be applied by an ultrasonic bonder chip 17, followed by slow cooling. In this manner the bonding is achieved by the melting of said soft metal solder with the resulting chemical bonding of oxygen present in the soft metal solder and oxygen present in the optical window, without any melting or deformation by softening of said optical window. Also the adhesion of the soft metal solder 15 to the support member 2 is achieved by diffusion of said solder into said support member. Also in consideration of the thermal expansion of the optical window 14 and the support member 2, these two members should preferably be characterized by the same thermal expansion coefficient in order to avoid eventual distortion. The precision of the surfaces of the optical window 14 scarcely changes by bonding.

The aforementioned coating 16 on the optical window 14 may be dispensed with if the amount of transmission or reflection of the laser light is not critical. In this manner the bonding in the present invention can be achieved without forming streaks or bubbles in the optical window 14 because of a low melting point of the soft metal solder 15.

The sealed cylindrical space thus formed by the support member 2 and the optical window 14 is filled with dry air or nitrogen maintained in vacuum, whereby the semi-conductor laser element achieves an extended service life and shows stable performance under various circumstances.

In the following there will be shown examples embodying the present invention.

EXAMPLE 1

In this example the support member 2 was composed of an alloy containing 29% of nickel, 18% of cobalt and iron in the remaining portion, while the optical window 14 was composed of an optical glass E2, of which linear expansion coefficients were respectively $47 \times 10^{-7}/°C$. and $49 \times 10^{-7}/°C$. As the soft metal solder there was employed a commercially available Sn-Pb alloy and a solder of a melting point of 190° C. including various additive elements to be explained later. As shown in FIG. 4, the soft metal solder 15 was placed with an ultrasonic bonder on a portion of the support member 2 coming into contact with the optical window 14. The amount of said solder had to be controlled adequately since excessive solder may spread on the surface of the optical window 14 to hinder the transmission of the laser light.

Figure 1:
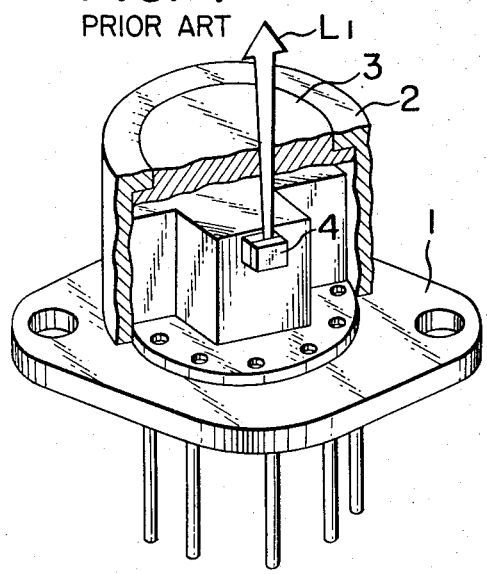
FIG. 1 is a partially broken away perspective view of a conventional semi-conductor laser apparatus.
Figure 3:
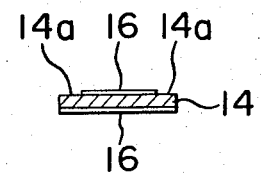
FIG. 3 is a cross-sectional view of the optical window.

Successively the support member 2 was placed on a hot plate 18 heated to 220° to 240° C. to melt said soft metal solder 15. Then the optical window 14 provided with a coating as shown in FIG. 3 was placed in the determined position of the support member 2, and the bonding between these two members were achieved by applying a pressure of ca. 5 Kg/cm² and a suitable ultrasonic wave for several seconds with said ultrasonic bonder chip 17. Subsequently the support member 2 was air cooled on a heat insulator.

The interferometric measurement of the surface distortion on the optical window 14 in thus completed semi-conductor laser apparatus with a light of a wavelength of 830 nm proved that the surface distortion was within ⅔ from an ideal plane in all the samples.

Also the strength of adhesion was higher than 10 Kg/cm², and the helium leak test showed no leaking through the bonded portion. Also as to the imaging performance, a beam spot of a diameter designed to be 100 μm was in fact reproduced at approximately 100 μm after passing through the optical window. On the other hand an optical window of a semi-conductor laser apparatus prepared in a conventional manner provided in a central portion thereof a spot diameter of 150 μm corresponding to a distortion of approximately 2λ, and showed an extremely large distortion in a peripheral portion.

EXAMPLE 2

The support member 2 was composed of an 18-8Ni alloy while the optical window 14 as composed of an optical glass F2, of which linear expansion coefficients were respectively $9.6-10.4 \times 10^{-6}/°C$. and $8.7 \times 10^{-6}/°C$. The soft metal solder 15 employed was same as that in the Example 1, and approximately same distortion and sealing property as in the Example 1 could be obtained by following the procedure described therein. Also the strength of adhesion was in a range of 10 Kg/cm², though there were observed certain fluctuations. Although the alloy used for the support member 2 and the glass used for the optical window 14 preferably have the same linear expansion coefficient, a slight difference in said coefficients does not give rise to a distortion in the glass since the soft metal solder itself is capable of absorbing certain distortion in the bonding method of the present invention.

EXAMPLE 3

The optical glass window 14 was provided on both surfaces thereof with anti-reflecting coatings of a suitable thickness matching a laser light wavelength of 830 nm and consisting of the layers of $ZrO_2$, $Al_2O_3$ and MgF in the order from the glass surface, said MgF layer contacting with air. The optical window 14 thus coated was subjected to ultrasonic bonding with the support member 2 by the soft metal solder placed therebetween. The strength of bonding obtained was less than 1 Kg/cm² with certain leaking in case said coatings were provided over the entire surface of the optical window 14, but the adhesion between the support member 2 and the optical window 14 without coatings on the peripheral portion to be bonded provided a sufficient strength and a sufficient sealing property as shown in the Example 1.

An adhesion between a metallic material and a non-metallic material or between a non-metallic material and another non-metallic material is strongly affected by the presence of an oxide, and cannot be made strong enough in the absence of an oxide on the surface of said non-metallic material. Consequently the bonding between the support member 2 and the optical window 14 can be made stronger in the absence of the coating layers as in the present example.

Naturally the three-layered coatings of $ZrO_2$, $Al_2O_3$ and MgF employed in the present example 3 may be replaced by any other coating matching the wavelength of the laser light to be transmitted.

Examples of the soft metal solder usable for ultrasonic bonding are as follows:
(1) Pb—Sn alloys
   additive elements: Zn, Ti, Si, Al, Bi, Sb
(2) In—Sn alloys
   additive elements: Zn, Sb, Ti, Bi
(3) Bi—Sn alloys
   additive elements: Zn, Ti, Si, Al, Bi, Sb
(4) Sn—Zn alloys
   additive elements: Zn, Ti, Si, Al, Bi, Sb The alloys (1) were employed in the foregoing examples.

As explained in detail above, the present invention is capable of stabilizing the beam diameter of the laser output light ordinarily caused by the distortion in the optical window, and of providing a semi-conductor laser apparatus with an improved hemetic sealing.

What I claim is:
1. A semi-conductor laser apparatus, comprising a semi-conductor laser element for generating a laser light;
   a light-transmitting member of an oxide for transmitting therethrough the laser light generated by said semi-conductor laser element;

a metallic support member for supporting said light-transmitting member; and a soft metal solder for fixing said light-transmitting member to said metallic support member and joining the two together by being chemically bonded with oxygen in said light-transmitting member to thereby be directly bonded to said light-transmitting member when said metal solder, in a molten state, is subjected to ultrasonic wave vibration.

2. A semi-conductor laser apparatus according to claim 1, wherein said light-transmitting member comprises a glass member.

3. A semi-conductor laser apparatus according to claim 1, wherein said soft metal solder contains an additive metal element which participates, as an oxide, in the oxygenic bonding at the junction between said soft metal solder and said light-transmitting member.

4. A semi-conductor laser apparatus according to claim 3, wherein said soft metal solder contains at least one of Pb—Sn alloys, In—Sn alloys, Bi—Sn alloys and Sn—Zn alloys.

5. A semi-conductor laser apparatus according to claim 2, wherein said soft metal solder contains an additive metal element which participates, as an oxide, in the oxygenic bonding at the junction between said soft metal solder and said light-transmitting member.

6. A semi-conductor laser apparatus according to claim 5, wherein said soft metal solder contains at least one of Pb—Sn alloys, In—Sn alloys, Bi—Sn alloys and Sn—Zn alloys.

7. A semi-conductor laser apparatus according to claim 1, wherein said light-transmitting member and said metallic support member are composed of materials having substantially the same thermal expansion coefficient.

8. A semi-conductor laser apparatus according to claim 2, wherein said light-transmitting member and said metallic support member are composed of materials having substantially the same thermal expansion coefficient.

9. A semi-conductor laser apparatus according to claim 1, wherein said light-transmitting member has an area bonded with said metallic support member through said soft metal solder, and an oxide is formed on said area.

10. A semi-conductor laser apparatus according to claim 2, wherein said light-transmitting member has an area bonded with said metallic support member through said soft metal solder, and an oxide is formed on said area.

11. A semi-conductor laser apparatus, comprising:
a semi-conductor laser element for generating a laser light;
a light-transmitting member for transmitting the laser light generated by said semi-conductor laser element;
a metallic support member for supporting said light-transmitting member;
a soft metal solder for fixing said light-transmitting member to said metallic support member and joining the two together by being chemically bonded with oxygen in said light-transmitting member to thereby be directly bonded to said light-transmitting member when said metal solder, in a molten state, is subjected to ultrasonic wave vibration; and
a case member defining with said metallic support member, said light-transmitting member and said soft metal solder, a hermetically sealed chamber within which is enclosed said semi-conductor laser element.

12. A semi-conductor laser apparatus according to claim 11, wherein said hermetically sealed chamber is filled with a dry air or nitrogen gas, or maintained at vacuum.

13. A semi-conductor laser apparatus according to claim 11, wherein said case member further includes a metallic cylindrical support integrated with said metallic support member for said light-transmitting member and a metallic base closing an end of said cylindrical support opposite said metallic support member for said light-transmitting member, and said semi-conductor laser element is held in a stationary position in said case member.

14. A semi-conductor laser apparatus according to claim 12, wherein said case member further includes a metallic cylindrical support integrated with said metallic support member for said light-transmitting member and a metallic base closing an end of said cylindrical support opposite said metallic support member for said light-transmitting member, and said semi-conductor laser element is held in a stationary position in said case member.

15. A semi-conductor laser apparatus according to claim 11, wherein said soft metal solder contains an additive metal element which participates, as an oxide, in the oxygenic bonding at the junction between said soft metal solder and said light-transmitting member.

16. A semi-conductor laser apparatus according to claim 12, wherein said soft metal solder contains an additive metal element which participates, as an oxide, in the oxygenic bonding at the junction between said soft metal solder and said light-transmitting member.

17. A semi-conductor laser apparatus according to claim 11, wherein said light-transmitting member and said metallic support member are composed of materials having substantially the same thermal expansion coefficient.

18. A semi-conductor laser apparatus according to claim 12, wherein said light-transmitting member and said metallic support member are composed of materials having substantially the same thermal expansion coefficient.

19. A semi-conductor laser apparatus according to claim 11, wherein said light-transmitting member has an area bonded with said metallic support member through said soft metal solder, and an oxide is formed on said area.

20. A semi-conductor laser apparatus according to claim 12, wherein said light-transmitting member has an area bonded with said metallic support member through said soft metal solder, and an oxide is formed on said area.

21. A semi-conductor laser apparatus according to claim 1, wherein said soft metal solder is sandwiched under a pressure between said light-transmitting member and said metallic support member when it is subjected to ultrasonic wave vibration, and uniform surface precision is maintained at the junction therebetween.

22. A semi-conductor laser apparatus according to claim 21, wherein said soft metal solder contains an additive metal element.

23. A semi-conductor laser apparatus according to claim 21, wherein said light-transmitting member and said metallic support member are composed of materials having substantially the same thermal expansion coefficient.

24. A semi-conductor laser apparatus according to claim 2, wherein said soft metal solder is sandwiched under a pressure between said light-transmitting member and said metallic support member when it is subjected to ultrasonic wave vibration, and uniform surface precision is maintained at the junction therebetween.

25. A semi-conductor laser apparatus according to claim 24, wherein said soft metal solder contains an additive metal element.

26. A semi-conductor laser apparatus according to claim 25, wherein said light-transmitting member and said metallic support member are composed of materials having substantially the same thermal expansion coefficient.

27. A semi-conductor laser apparatus according to claim 11, wherein said soft metal solder is sandwiched under a pressure between said light-transmitting member and said metallic support member when it is subjected to ultrasonic wave vibration, and uniform surface precision is maintained at the junction therebetween.

28. A semi-conductor laser apparatus according to claim 27, wherein said soft metal solder contains an additive metal element.

29. A semi-conductor laser apparatus according to claim 28, wherein said light-transmitting member and said metallic support member are composed of materials having substantially the same thermal expansion coefficient.

30. A semi-conductor laser apparatus according to claim 12, wherein said soft metal solder is sandwiched under a pressure between said light-transmitting member and said metallic support member when it is subjected to ultrasonic wave vibration, and uniform surface precision is maintained at the junction therebetween.

31. A semi-conductor laser apparatus according to claim 30, wherein said soft metal solder contains an additive metal element.

32. A semi-conductor laser apparatus according to claim 31, wherein said light-transmitting member and said metallic support member are composed of materials having substantially the same thermal expansion coefficient.

* * * * *

UNITED STATES PATENT AND TRADEMARK OFFICE
CERTIFICATE OF CORRECTION

PATENT NO. : 4,403,243

DATED : September 6, 1983

INVENTOR(S) : ISAO HAKAMADA

It is certified that error appears in the above-identified patent and that said Letters Patent is hereby corrected as shown below:

Column 3

Line 65, change "18-8Ni" to --18Cr-8Ni--.

Signed and Sealed this

Thirty-first Day of January 1984

[SEAL]

Attest:

GERALD J. MOSSINGHOFF

Attesting Officer    Commissioner of Patents and Trademarks